United States Patent
Kang et al.

(10) Patent No.: US 7,596,193 B2
(45) Date of Patent: Sep. 29, 2009

(54) VARIABLE BANDWIDTH AUTOMATIC GAIN CONTROL

(75) Inventors: Insung Kang, San Diego, CA (US); Tarun K. Tandon, San Diego, CA (US)

(73) Assignee: VIA Telecom, Inc., San Diego, CA (US)

( * ) Notice: Subject to any disclaimer, the term of this patent is extended or adjusted under 35 U.S.C. 154(b) by 589 days.

(21) Appl. No.: 11/369,313

(22) Filed: Mar. 6, 2006

(65) Prior Publication Data

US 2007/0147556 A1 Jun. 28, 2007

Related U.S. Application Data

(60) Provisional application No. 60/735,466, filed on Nov. 9, 2005.

(51) Int. Cl.
*H04L 27/08* (2006.01)
*H04B 7/00* (2006.01)

(52) U.S. Cl. .................... 375/345; 455/232.1

(58) Field of Classification Search ............... 375/317, 375/319, 345; 455/138, 232.1, 234.1–234.2
See application file for complete search history.

(56) References Cited

U.S. PATENT DOCUMENTS

| | | | |
|---|---|---|---|
| 4,326,226 A | 4/1982 | Touchton et al. | |
| 5,392,456 A | 2/1995 | Mitomo et al. | |
| 5,608,428 A | 3/1997 | Bush | |
| 6,563,891 B1 * | 5/2003 | Eriksson et al. | 375/345 |
| 6,771,719 B1 * | 8/2004 | Koyama et al. | 375/345 |
| 7,496,163 B2 * | 2/2009 | Terao | 375/345 |
| 2001/0026512 A1 | 10/2001 | Nishimura et al. | |
| 2002/0187765 A1 * | 12/2002 | Kozak et al. | 455/232.1 |
| 2003/0096587 A1 | 5/2003 | Wildhagen | |
| 2005/0129150 A1 * | 6/2005 | Terao | 375/345 |
| 2006/0222118 A1 * | 10/2006 | Murthy et al. | 375/345 |

* cited by examiner

*Primary Examiner*—Khanh C Tran
(74) *Attorney, Agent, or Firm*—James W. Huffman; Joseph Swan

(57) ABSTRACT

Provided is automatic gain control (AGC) in which a feedback filter has a parameter that is changed based on information regarding data-packet boundaries. In one representative embodiment, the bandwidth of the filter temporarily is increased, or the time constant of the AGC filter temporarily is decreased, within a vicinity of each actual or potential packet boundary.

11 Claims, 3 Drawing Sheets

VARIABLE BANDWIDTH AUTOMATIC GAIN CONTROL

Priority is claimed to U.S. Provisional Patent Application Ser. No. 60/735,466, filed on Nov. 9, 2005, and also titled "Variable Bandwidth Automatic Gain Control", which application is incorporated by reference herein as though set forth herein in full.

FIELD OF THE INVENTION

The present invention pertains to automatic gain control in a data-packet-based communication receiver, such as a receiver in a wireless CDMA 1xEVDO system or a receiver in a wireless 802.11 network.

BACKGROUND

FIG. 1 illustrates a block diagram of a conventional automatic gain control (AGC) system 10. AGC is a signal-processing technique that is used, inter alia, by a communication receiver to dynamically compensate for widely varying channel gains encountered in various wireless and wire-line transmission channels 12. In a conventional approach, the AGC block 10 forms a loop by estimating 16 the signal strength of the received signal at the output of a variable-gain block 14, filtering 18 the estimate to smooth out the instantaneous variations (e.g., due to noise), comparing the results to a specified target value 19, and then changing the gain in variable-gain block 14 in a feedback fashion in an attempt to maintain the received signal strength at the specified target value 19. The gain-adjusted signal is-then subsequently processed 20 to decode the information embedded in the received signal.

The loop filter 18 is usually designed to have a fixed time-constant that is chosen to achieve a balance between the contradictory requirements of broader loop bandwidth for faster AGC loop tracking of the input signal strength variations (due to changes in the gain in transmission channel 12) and narrower bandwidth to reduce noise. Any difference between the filtered estimate and the specified target value is assumed to have been caused by a change in gain in the transmission channel 12 from the last measurement. Accordingly, this difference is used to control the gain in block 14, in a feedback fashion. Under appropriate circumstances, this feedback process ensures stable tracking and compensation for changes in the channel gain in an iterative manner.

However, the present inventors have discovered that the fixed bandwidth of the conventional receiver AGC loop filter 18 typically is optimized for a received signal that is continuous in nature and does not work very well with a received signal that is discontinuous in nature (e.g., packet transmissions) or has step changes in its strength. This is because of the fixed time-constant of the AGC loop-filter, which is typically selected to keep the loop bandwidth narrow so as to keep the noise in the signal strength estimates 16 from causing spurious jumps in the receiver gain 14 being controlled by the AGC loop 10. To be able to track such step changes in received signal strength with conventional AGC, the AGC loop bandwidth ordinarily would have to be kept larger, but that approach generally results in increased noise through the AGC loop 10.

SUMMARY OF THE INVENTION

The present invention addresses this problem by providing automatic gain control (AGC) in which a feedback filter has a parameter that is changed based on information regarding data-packet boundaries. In one representative embodiment, the bandwidth of the filter temporarily is increased, or the time constant of the AGC filter temporarily is decreased, within a vicinity of each actual or potential packet boundary.

In a more specific embodiment, the present invention addresses the above-referenced problem by widening the AGC loop bandwidth to make it periodically faster (e.g., at, or within a vicinity of, the actual or potential data-packet boundaries for discontinuous signals) so as to allow faster tracking of any step changes in the input signal strength. At all other times, the AGC loop bandwidth is kept narrow enough to offer sufficient filtering of the noise-induced variations in the input signal strength. Thus, by keeping the AGC loop bandwidth sufficiently narrow (e.g., slower tracking) for most of the time and broadening it periodically (e.g., faster tracking), AGC according to the present invention can track discontinuous changes in signal strength without sacrificing noise performance of the AGC loop for most of the duration of the signal. In short, by virtue of the foregoing arrangement, it often is possible to more accurately accommodate changing power levels at the transmission side, while simultaneously suppressing unnecessary noise in the AGC loop.

The foregoing summary is intended merely to provide a brief description of the general nature of the invention. A more complete understanding of the invention can be obtained by referring to the claims and the following detailed description of the preferred embodiments in connection with the accompanying figures.

DESCRIPTION OF THE PREFERRED EMBODIMENT(S)

Figure 1:
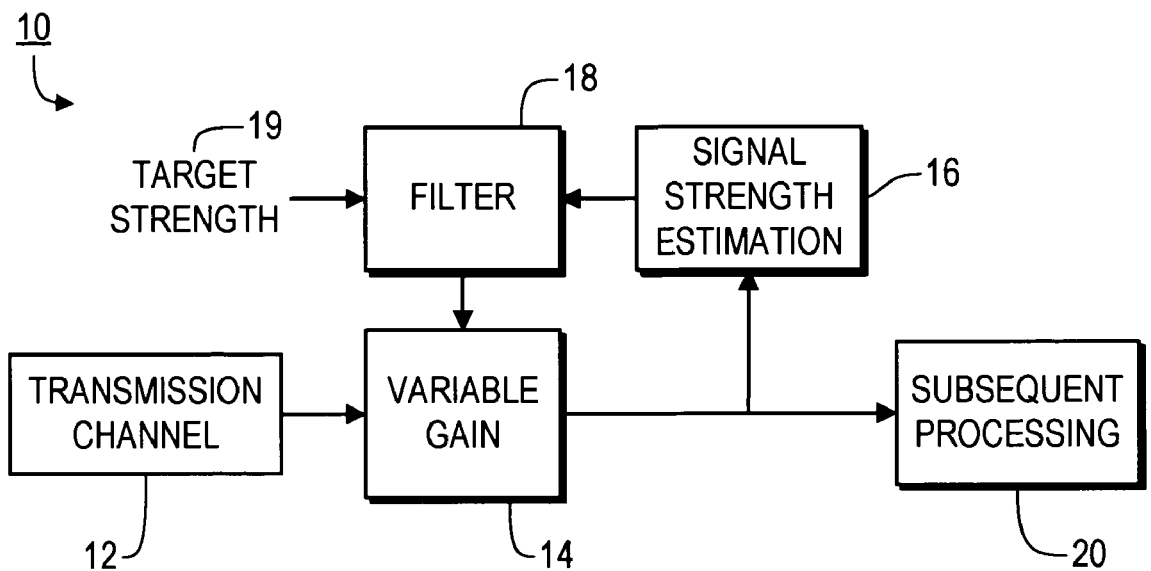
FIG. 1 is a block diagram of a conventional automatic gain control circuit.
Figure 2:
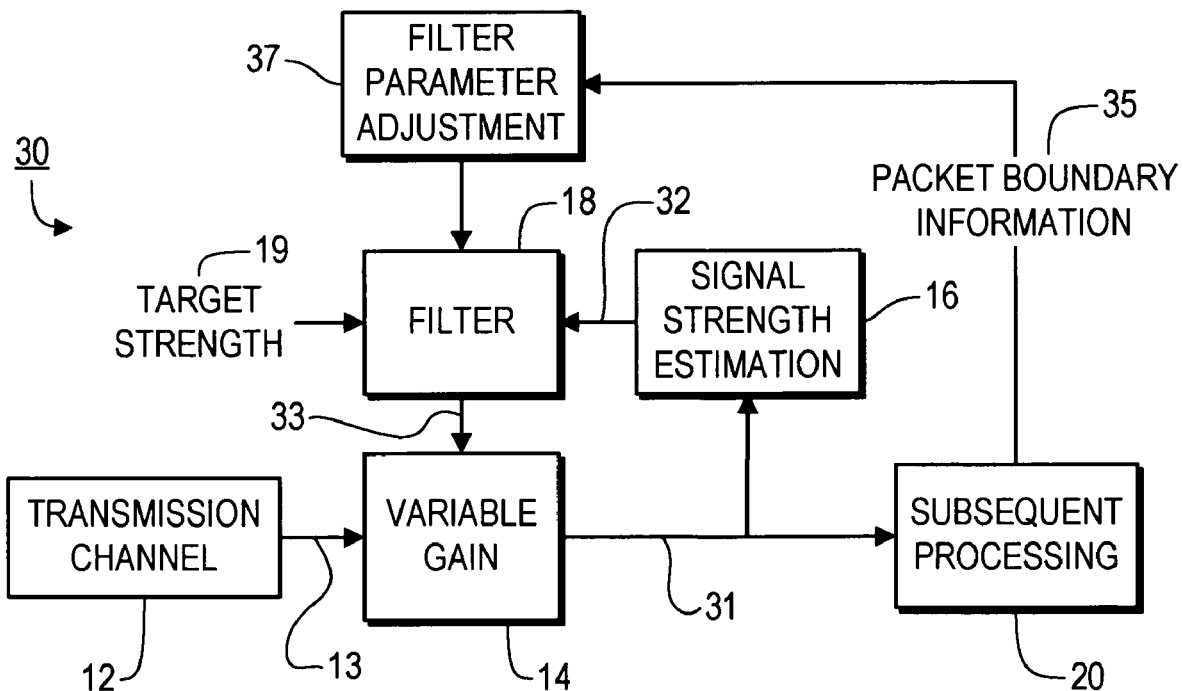
FIG. 2 is a block diagram of an automatic gain control circuit according to a representative embodiment of the present invention.

FIG. 2 is a block diagram of an automatic gain control system 30 according to a representative embodiment of the present invention. As with the conventional AGC system 10 shown in FIG. 1, the strength of a signal 13 received through a transmission channel 12 is modified in variable gain block 14. In this regard, block 14 may be a digital or analog component and may function as an attenuator, an amplifier or both. The strength (e.g., magnitude or power) of the gain-adjusted signal 31 is then estimated in block 16. The resulting strength-estimate signal 32 is provided to filter 18, which filters it and then compares it to a specified target strength 19 or, correspondingly, which compares the strength-estimate signal 32 to the specified target strength 19 and then filters the comparison. In either event, a control signal 33 is generated and is used to control the gain of block 14. Thus, the AGC loop permits tracking of changes in the gain of the transmission channel 12 while simultaneously filtering out noise. The gain-controlled signal 31 is then subject to subsequent processing 20 to decode the information in the received signal 13.

As noted above, the transmission channel 12 may be wireless or hardwired; for instance, in representative embodiments transmission channel 12 is a wireless link in a code division multiple access (CDMA) system (e.g., using 1xEVDO protocols) or a wireless link in an IEEE 802.11 system (e.g., 802.11a, 802.11b or 802.11g). Also, it should be noted that FIG. 2 provides only a high-level block diagram illustrating the operation of the AGC system 30. Accordingly, various components, such as frequency-shifting components, are not shown in FIG. 2.

The general purpose of AGC loop 30 is to provide processing block 20 with a signal having an average strength that is as close as possible to the specified target signal strength 19. Accordingly, filter block 18 generates a comparison (c) between the estimated signal strength (e) and the target signal strength 19 (t) and then filters the comparison, i.e., $f(c)$. In practice, the comparison signal generally will be the simple difference between the estimate and the target, i.e., $c=e-t$ (although it instead could be a ratio or any other comparison measure). In addition, if we assume that the filter 18 is linear, then $f(c)=f(e)-k$, where $k=f(t)$ is a constant. Moreover, even if the filter 18 is nonlinear, if t is a constant then $f(c)$ generally can be implemented as $f'(e)$. That is, in either case only the actual estimated signal strength 32 need be filtered.

Accordingly, references herein to filtering the comparison signal also are intended to cover implementations where the filtering function is in fact only applied to the estimated signal strength, as well as implementations where the filtering function is first applied to the estimated signal strength and then the filtered signal is compared to the target strength 19, with all of the foregoing implementations typically being equivalent to each other.

One difference between the AGC loop 30 of the present invention and a conventional AGC loop 10 is the present invention's additional feedback of information 35 regarding the timing of data-packet boundaries. More specifically, the present invention pertains to communications systems in which data are transmitted in discrete packets. Accordingly, discrete data-packet intervals exist. The communication protocol defines a specific arrangement of slots, with each data packet occupying an integer number of data slots. That is, a slot is a time unit during which a data packet (or a portion thereof) can be transmitted. A data packet can be transmitted in a single slot or in multiple slots. Accordingly, the slot boundaries are the actual or potential data packet boundaries. If a data packet is available for communication at the transmitter during a particular slot, then that data packet (or a portion of it) is transmitted during the corresponding slot. Otherwise, nothing is transmitted during the subject slot. The resulting transmission pattern is discontinuous, with transmission during discrete periods of time.

Figure 3:
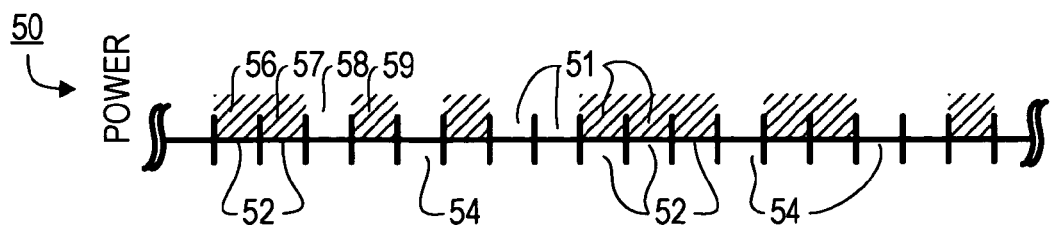
FIG. 3 illustrates a portion of a transmission timeline for data-packet communications.

An example of a data-packet transmission timeline 50 is shown in FIG. 3. In this example, an arrangement of equally spaced contiguous data slots 51 is defined. Slots 51 can be divided into slots 52, during which a data packet (or a portion thereof) is transmitted, and slots 54, during which no data are transmitted. Data packets (or portions thereof) often will occupy multiple data slots 52, followed by periods of one or more slots 54 in which no transmission occurs. Four contiguous data slots 56-59 are separately identified in FIG. 3 for use as examples in the following discussion.

Figure 4:
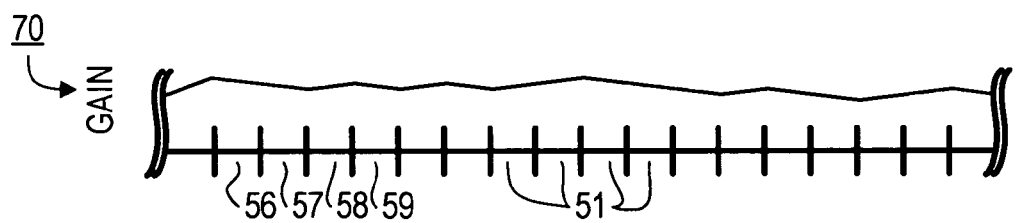
FIG. 4 illustrates the gain applied in a representative conventional AGC loop in response to the input signal shown in FIG. 3, assuming a constant gain in the transmission channel.

In response to the specific transmission 50 shown in FIG. 3, and assuming a constant gain in the transmission channel 12, a conventional AGC loop (e.g., loop 10) having a long time-constant relative to the duration of a single data-packet interval might set the gain of block 14 according to the profile 70 shown in FIG. 4. Specifically, due to the built-in relatively slow response of filter 18, the gain declines relatively slowly when data packets are being transmitted (in response to the increased power, which is interpreted as a change in the gain of transmission channel 12) and increases at a similar rate when no data packet is being transmitted. The average gain depends upon the percentage of the total number of data slots 51 in which a data packet is transmitted (i.e., the total number of data slots 52 divided by the sum of the total number of data slots 51, which include data slots 52 and data slots 54). In other words, the gain typically will not reach the optimal level for data packet transmission, but instead will be biased somewhat higher, with the precise level being dependent upon average transmission frequency. Similarly, the gain typically will not reach the optimal level when no data packet is transmitted, but instead will be biased somewhat lower, again with the precise level dependent upon the average transmission frequency.

In order to address this problem, the present invention uses the data-packet boundary information 35 that is fed back from the subsequent processing section 20 in order to adjust at least one of the parameters of AGC filter 18. Thus, referring back to FIG. 2, during the course of the subsequent processing 20, packet boundary information 35 is generated in the normal course of decoding the information in the received signal 13. In the present embodiment, the received signal 13 is a synchronous data signal and so the data slots 51 occur at fixed regular intervals. Once the receiver processing section 20 synchronizes to the timing of the received signal 13, the data slots 51 typically are known for the entire communication session.

Information 35 regarding where the data-packet boundaries occur is then fed back for use by filter 18. In practice, some adjustment may be made to the data-packet boundaries, as such boundaries are identified in subsequent processing section 20, in order to account for the signal-propagation delay that occurs between the receiver portion 30 and the subsequent processing section 20 of the subject device.

Figure 5:
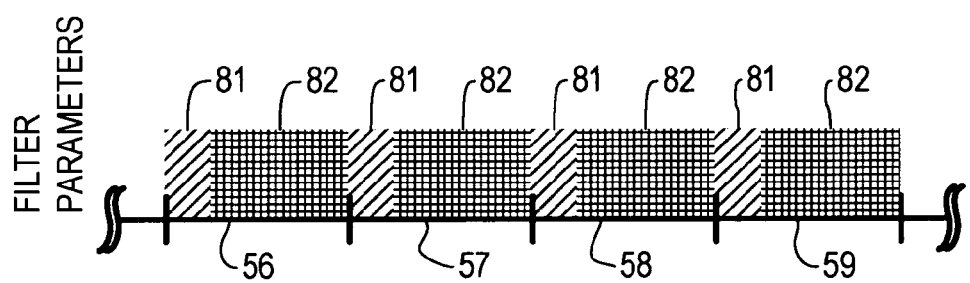
FIG. 5 illustrates a timeline for filter-parameter adjustment according to a first representative embodiment of the present invention.

In any event, a filter-parameter adjustment module 37 uses the packet boundary information 35 to adjust at least one of the parameters of filter 18. In a first representative embodiment of the invention, module 37 temporarily increases the bandwidth, or reduces the time constant, of filter 18 at the beginning of each data slot 51, as shown in FIG. 5. Referring to FIG. 5, at the beginning of each data slot 51 a parameter of the filter 18 is changed for a specified period of time 81 and then is changed back to the default value for the remainder 82 of the data slot 51. In the present embodiment, the data slots 51 have a constant fixed duration and the specified period of time 81 also is constant and fixed.

Typically, the AGC filter 18 is a digital filter. Accordingly, parameter-adjustment module 37 typically need only directly alter the filter's parameters, e.g., the weighting profile applied to a sequence of samples within a moving window, in order to effect the foregoing change. In alternate embodiments, one filter is used for time period 81 and an entirely different filter is used for time period 82. However, even in such alternate embodiments, a wider bandwidth (or shorter time constant) is in effect during time period 81 than during time period 82.

As indicated above, the temporary change in the parameter(s) of filter 18 preferably permits the AGC loop 30 to quickly adjust to a transition from a "no data transmission" slot 54 to "data transmission" slot 52, or from a "data transmission" slot 52 to a "no data transmission" slot 54. A transition of either type is referred to herein as a "transmission boundary" or a "data-packet boundary".

In order to adjust to a transmission boundary, the magnitude of the change in the time constant (or bandwidth) of filter 18 can be traded off against the duration of the change interval 81 to achieve the desired result. Generally speaking, adjusting over a relatively short period of time 81 will maximize the amount of time at which the gain is correctly set, while adjusting over a relatively longer period of time 81 will reduce noise that is introduced during the adjustment period 81 and, accordingly, the total amount of noise admitted.

Figure 6:
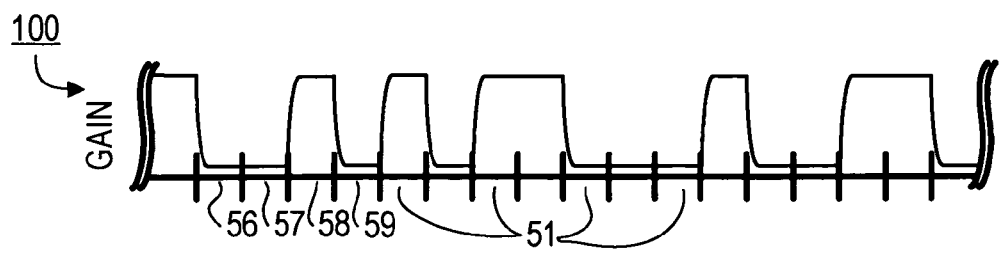
FIG. 6 illustrates the gain profile that results in response to the input signal shown in FIG. 3 when temporarily increasing the bandwidth, or reducing the time constant, of the AGC filter starting at the beginning of each data slot, according to the first representative embodiment of the present invention, again assuming a constant gain in the transmission channel.

FIG. 6 illustrates the gain profile 100 that results when temporarily increasing the bandwidth, or reducing the time constant, of filter 18 at the beginning of each data slot 51. As shown, because of the faster tracking during the beginning 81 of each data slot 51, the gain is able to reach the level that is appropriate for the transmission (or lack of transmission) very quickly. The result is that more optimal gain settings are achieved, i.e., higher gains when no signal is being transmitted and lower gains when a signal is being transmitted, as compared to the gain profile 70 that would be achieved by a conventional AGC loop 10. At the same time, because the time-constant (or bandwidth) is only adjusted for a fraction of the total timeline in the preferred embodiments of the invention, less noise typically is admitted than if the filter 18 were designed so as to provide uniformly fast tracking.

It also should be understood that in certain protocols the slots used to transmit a single data packet are not contiguous. For example, in a wireless CDMA 1xEVDO system a 4-slot data packet might be transmitted at slots x, x+4, x+8 and x+12. For ease of illustration only, the following discussion assumes that the slots for a data packet are contiguous. However, in many embodiments this will not be the case, and the present invention is intended to encompass both contiguous and non-contiguous packets, as well as fixed-length and variable-length packets.

The foregoing embodiment of the invention concerns a relatively simple adjustment technique in which the parameter of filter 18 is adjusted at the beginning of each data slot 51. In alternate embodiments, even better results can be achieved if more information is available regarding the true data-packet boundaries. For example, in a wireless CDMA 1xEVDO system a single data packet can be 1, 2, 4, 8 or 16 data slots long, with each data slot being 1.66667 ms (milliseconds) in duration, and with the preamble of each data packet (which occurs in the first slot of the packet) specifying the packet's actual length. Accordingly, once the preamble is decoded (in subsequent processing block 20) the true end of the current data packet is known. This information preferably is fed back, together with information regarding the boundaries for the data slots 51, as packet boundary information 35.

Figure 7:
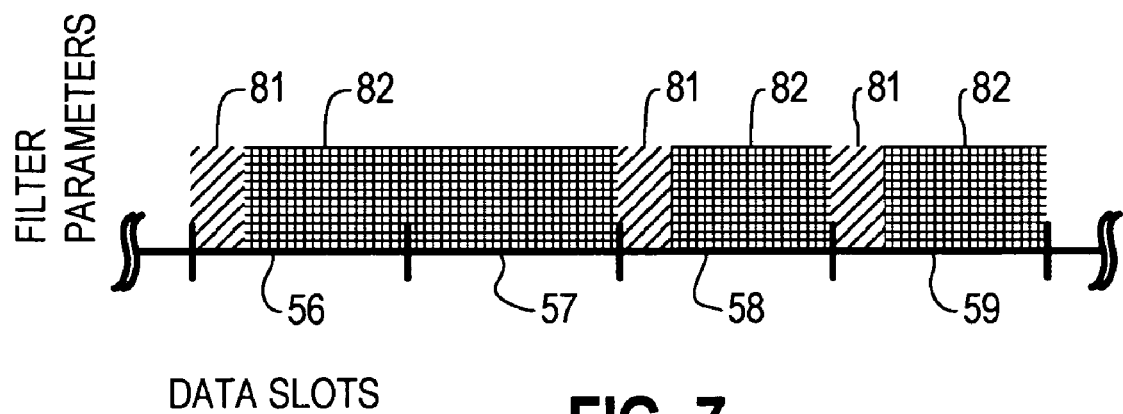
FIG. 7 illustrates a timeline for filter-parameter adjustment according to a second representative embodiment of the present invention.

The result is illustrated in FIG. 7. As shown, the bandwidth of filter 18 temporarily is increased (or the time constant decreased) at the beginning 81 of data slot 56. When the information from data slot 56 is decoded in processing block 20 a determination is made that the transmitted data packet is two data slots long. Accordingly, when this information 35 is fed back, adjustment block 37 knows that the bandwidth of filter 18 need not be increased (or the time constant decreased) during any portion of data slot 57, so that the default filter parameters 82 are applied during all of data slot 57. Until the next multi-slot data packet is received, adjustment block 37 then continues to adjust the parameter of filter 18 at the beginning 81 of each subsequent data slot 51 (including data slots 58 and 59, as shown in FIG. 7).

Figure 8:
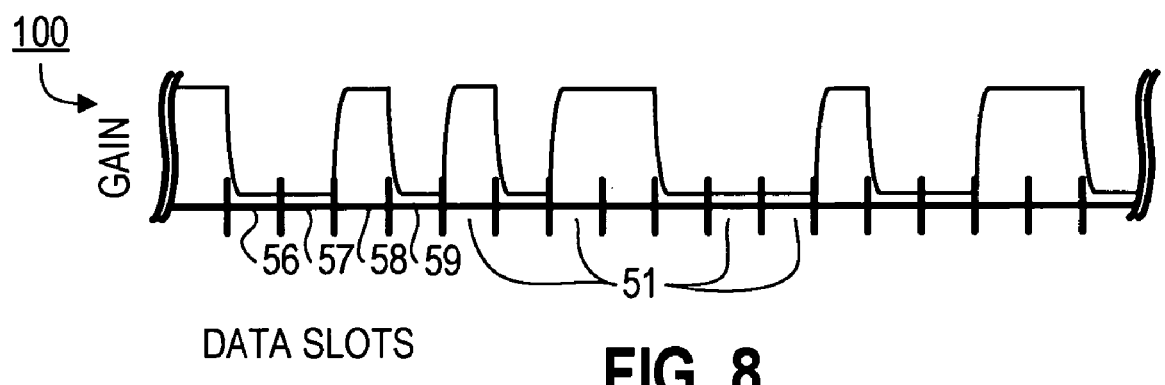
FIG. 8 illustrates the gain profile that results in response to the input signal shown in FIG. 3 when temporarily increasing the bandwidth, or reducing the time constant, of the AGC filter according to the second representative embodiment of the present invention, again assuming a constant gain in the transmission channel.

As shown in FIG. 8, the resulting theoretical gain profile 100, assuming no noise or change in the gain of transmission channel 12, is identical in this embodiment to the gain profile 100 of the previous embodiment discussed above (shown in FIG. 6). The main difference is observed when the effects of noise are taken into consideration. In that case, the shortened period of time during which the increased bandwidth is in effect (e.g., no period 81 for data slot 57 in the example of FIG. 7) means that less noise typically will be admitted.

More generally, it is preferable to include as much information as possible (i.e., as available) regarding the data-packet boundaries in the information 35 that is fed back for use in adjusting the bandwidth, time constant or other parameter(s) of filter 18. By doing so, it often will be possible to reduce the amount of time during which filter 18 is more sensitive to noise, thereby further reducing the overall level of admitted noise.

The extension to non-contiguous data packets is straightforward. Once the first slot 52 has been decoded, the locations of the other slots 52 making up the data packet are known. If the transmission statuses of any two data slots 51 are known (i.e., whether they are transmission slots 52 or non-transmission slots 54), then it is easily determined whether a transmission boundary exists between them. If a transmission boundary does in fact exist or if it is unknown whether a transmission boundary exists, then the parameter(s) of the filter 18 preferably are adjusted (e.g., by increasing the bandwidth) for a period of time 81 within a proximity of the beginning of the second such data slot 51. On the other hand, if it is known that a transmission boundary does not exist, then preferably no such adjustment interval 81 is used during the second of the two data slots 51 (i.e., the default filter parameters are maintained for the entirety of the second data slot 51).

It is noted that the foregoing discussion generally focuses on a single received signal. However, it often will be the case that the received radio signal 13 is in fact an aggregate of multiple signals from multiple different transmitters, with each transmitter operating on a different channel (e.g., a different code channel in a CDMA system). If all of the transmitters are synchronized to the same timing pattern, i.e., all have the same data-slot boundaries, then implementation of the first embodiment discussed above generally can proceed in the same manner as if there were only a single transmitter.

However, in such a case, rather than considering only a single binary transmission boundary (from transmit to no-transmit or vice versa) it generally will be the case that at each data slot 51 there will be a probability distribution for the change in the transmission power, corresponding to the probabilities that the various transmitters will be transitioning from transmit to no-transmit or vice versa. Accordingly, the selection of the amount in the increase in the bandwidth (or reduction in the time constant) of the filter 18 and the selection of the duration 81 of the change may be made: to accommodate the expected absolute worst-case change in received signal power, to accommodate the average expected change in received signal power, or to accommodate anything in between (e.g., the expected worst-case change over 1, 2, 3, 4 or 5 standard deviations, so that for some expected percentage of data-packet boundaries the change in received signal power will be too great to be fully tracked during the temporary period 81 of faster tracking).

On the other hand, if the timings of the various transmitters are not synchronized with each other, or if the second embodiment discussed above is being implemented, then it is possible to adjust the parameter(s) of filter 18 for a specified amount of time 81 after the beginning of the identified packet boundary for each transmitter that is being monitored. In such a case, a lookup table preferably is used for adjusting the parameter(s) of filter 18, with the actual adjustment depending upon how many different time periods 81 (corresponding to different monitored transmitters) currently are overlapping. Once again, such a lookup table preferably relies upon the expected statistical distribution of such multiple transmitters transitioning from transmit to no-transmit and vice versa.

In any of the foregoing cases, there typically still will be discrete changes in the received signal power that are due to one or more transmitters starting to transmit after at least one silent data-packet interval and/or stopping transmission after at least one data-packet interval during which a data packet was transmitted. Accordingly, in such cases the gain profile 100 of FIGS. 6 and 8 will be modified so as to show transitions between any of three or more different power levels (with the actual number of different potential power levels corresponding to the number of transmitters being monitored), rather than transitions between only two different power levels (as actually shown in FIGS. 6 and 8).

System Environment

Generally speaking, all of the systems, methods and techniques described herein can be practiced with the use of a general-purpose computer system. Such a computer typically will include, for example, at least some of the following components interconnected with each other, e.g., via a common bus: one or more central processing units (CPUs); read-only memory (ROM); random access memory (RAM); input/output software, circuitry for both for interfacing with other devices (e.g., using a hardwired connection, such as a serial port, a parallel port, a USB connection or a firewire connection, or using a wireless protocol, such as Bluetooth or a 802.11 protocol) and for connecting to one or more networks (e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system), which networks, in turn, in many embodiments of the invention, connect to the Internet or to any other networks); a display (such as a cathode ray tube display, a liquid crystal display, an organic light-emitting display, a polymeric light-emitting display or any other thin-film display); other output devices (such as one or more speakers, a headphone set and a printer); one or more input devices (such as a mouse, touchpad, tablet, touch-sensitive display or other pointing device, a keyboard, a keypad, a microphone and a scanner); a mass storage unit (such as a hard disk drive); a real-time clock; a removable storage read/write device (such as for reading from and writing to RAM, a magnetic disk, a magnetic tape, an opto-magnetic disk, an optical disk, or the like); and a modem (e.g., for sending faxes or for connecting to the Internet or to any other computer network via a dial-up connection). In operation, the process steps to implement the above methods and functionality, to the extent performed by such a general-purpose computer, typically initially are stored in mass storage (e.g., the hard disk), are downloaded into RAM and then are executed by the CPU out of RAM.

Suitable computers for use in implementing the present invention may be obtained from various vendors. Various types of computers may be used depending upon the size and complexity of the tasks. Suitable computers include mainframe computers, multiprocessor computers, workstations, personal computers, and even smaller computers such as PDAs, wireless telephones or any other appliance or device, whether stand-alone, hard-wired into a network or wirelessly connected to a network.

In addition, although a general-purpose computer system has been described above, in alternate embodiments a special-purpose processor or computer instead (or in addition) is used. In general, any of the functionality described above can be implemented in software, hardware, firmware or any combination of these, with the particular implementation being selected based on known engineering tradeoffs. In this regard, it is noted that the functionality described above is implemented through fixed logical steps and therefore can be accomplished through programming (e.g., software or firmware), an appropriate arrangement of logic components (hardware) or any combination of the two, as is well-known in the art.

In one representative embodiment of the invention, all of the relevant components and the functionality described above are implemented in digital circuitry. In a somewhat modified embodiment, all of such components and functionality other than the variable-gain component 14 are implemented in digital circuitry, and the variable-gain component 14 is an analog amplifier and/or attenuator, with its output being converted by an analog-to-digital converter (not shown) into a digital signal for processing in modules 16, 20 and 37.

It should be understood that the present invention also relates to machine-readable media on which are stored program instructions for performing the methods and functionality of this invention. Such media include, by way of example, magnetic disks, magnetic tape, optically readable media such as CD ROMs and DVD ROMs, or semiconductor memory such as PCMCIA cards, USB memory devices, etc. In each case, the medium may take the form of a portable item such as a small disk, diskette, cassette, etc., or it may take the form of a relatively larger or immobile item such as a hard disk drive, ROM or RAM provided in a computer.

The foregoing description primarily emphasizes electronic computers. However, it should be understood that any other type of computer instead may be used, such as a computer utilizing any combination of electronic, optical, biological and chemical processing.

Additional Considerations

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for controlling gain in a signal receiver, comprising components configured to:
   (a) a variable-gain component that receives and applies a specified gain to an incoming signal, thereby providing a gain-adjusted signal;
   (b) a detector coupled to an output of the variable-gain component that measures strength of the gain-adjusted signal;
   (c) a filter, coupled to an output of the detector, that generates a control signal by filtering a signal that is based on the strength of the gain-adjusted signal, wherein the specified gain is controlled based on the control signal; and
   (d) a signal-processing section that processes the gain-adjusted signal to identify information regarding data-packet boundaries; and
   (e) an adjustment module, coupled to the signal-processing section, that alters a parameter of the filter based on the information regarding data-packet boundaries.

2. An apparatus according to claim 1, wherein said adjustment module temporarily changes a bandwidth of the filtering within a vicinity of the data-packet boundaries.

3. An apparatus according to claim 2, wherein the bandwidth of the filtering is temporarily increased within the vicinity of the data-packet boundaries.

4. An apparatus according to claim 3, wherein both an amount of increase in the bandwidth and a duration of the increase are fixed in advance at constant values for all of the data-packet boundaries.

5. An apparatus according to claim 3, wherein the control signal represents a comparison of the strength of the gain-adjusted signal to a target signal strength, wherein a duration of the increase is a fraction of a data packet interval, and wherein the increase in the bandwidth is sufficient to achieve the target signal strength in response to a transmission boundary by completion of the duration of the increase.

6. An apparatus according to claim 1, wherein the incoming signal is synchronous.

7. An apparatus according to claim 1, wherein the parameter of the filtering is altered by said adjustment module based on an expectation regarding behaviors of plural different transmitters.

8. An apparatus according to claim 1, wherein the parameter of the filtering is altered by said adjustment module based on identified data-packet boundaries that are different for each of plural different transmitters.

9. An apparatus according to claim 1, wherein the control signal represents a comparison of the strength of the gain-adjusted signal to a target signal strength.

10. An apparatus according to claim 1, wherein the incoming signal has been received across a communication channel.

11. An apparatus for controlling gain in a signal receiver, comprising:
   (a) means for applying a specified gain to an incoming signal, thereby providing a gain-adjusted signal;
   (b) means for measuring strength of the gain-adjusted signal;
   (c) means for generating a control signal by filtering a signal that is based on the strength of the gain-adjusted signal;
   (d) means for controlling the specified gain based on the control signal;
   (e) means for processing the gain-adjusted signal to identify information regarding data-packet boundaries; and
   (f) means for altering a parameter of the filtering by said means (c) based on the information regarding data-packet boundaries.

* * * * *